United States Patent
Chen et al.

(10) Patent No.: US 6,566,183 B1
(45) Date of Patent: May 20, 2003

(54) METHOD OF MAKING A TRANSISTOR, IN PARTICULAR SPACERS OF THE TRANSISTOR

(76) Inventors: Steven A. Chen, 2278 Quail Bluff Pl., San Jose, CA (US) 95121; Lee Luo, 222 Brunswick Pl., Fremont, CA (US) 94539; Kegang Huang, 44100 Packard Ct., Fremont, CA (US) 94539; Tzy-Tzan Fu, 6F-1, No. 90, University Road, Hsin-Chu 300 (TW); Kuan-Ting Lin, 30-3 Chung $4^{th}$ Road, Keelung (TW); Hung-Chuan Chen, No. 7, Alley 435, Lane 640, Jungshan Road, Hsin-Chu 300 (TW)

( * ) Notice: Subject to any disclaimer, the term of this patent is extended or adjusted under 35 U.S.C. 154(b) by 0 days.

(21) Appl. No.: 10/017,192

(22) Filed: Dec. 12, 2001

(51) Int. Cl.$^7$ .......................................... H01L 21/8238
(52) U.S. Cl. ...................... 438/230; 438/595; 438/791
(58) Field of Search ................................ 438/791–794, 438/775, 624, 184, 230, 303, 595

(56) References Cited

U.S. PATENT DOCUMENTS

| | | | | |
|---|---|---|---|---|
| 3,652,324 A | * | 3/1972 | Chu et al. ..................... 216/62 |
| 5,330,936 A | * | 7/1994 | Ishitani ........................ 438/399 |
| 6,093,594 A | * | 7/2000 | Yeap et al. .................. 257/392 |
| 6,380,606 B1 | * | 4/2002 | Brady et al. ................. 257/500 |
| 2002/0028290 A1 | * | 3/2002 | Cook et al. ............ 427/255.28 |

* cited by examiner

Primary Examiner—Phat X. Cao
Assistant Examiner—Thao X. Le
(74) Attorney, Agent, or Firm—Blakely Sokoloff Taylor & Zafman

(57) ABSTRACT

The invention provides a method of making a transistor. A gate dielectric layer is formed on a semiconductor substrate. A gate is formed on the dielectric layer, the gate having an exposed upper surface and exposed side surfaces. A first silicon nitride layer having a first thickness is deposited over the gate, for example over an oxide layer on the gate, at a first deposition rate. A second silicon nitride layer having a second thickness is deposited over the first silicon nitride layer at a second deposition rate, the second thickness being more that the first thickness and the second deposition rate being more than the first deposition rate. The first silicon nitrogen layer then has a lower hydrogen concentration. At least the second silicon nitride layer (or a silicon oxide layer in the case of an ONO spacer) is etched to leave spacers next to the side surfaces while exposing the upper surface of the gate and areas of the substrate outside the spacers.

20 Claims, 4 Drawing Sheets

METHOD OF MAKING A TRANSISTOR, IN PARTICULAR SPACERS OF THE TRANSISTOR

BACKGROUND OF THE INVENTION

1). Field of the Invention

This invention relates generally to a method of making a transistor and more specifically to a method according to which side wall spacers of the transistor are made.

2). Discussion of Related Art

Electronic circuits are often manufactured in and on semiconductor wafers. Such an electronic circuit often includes millions of tiny transistors. Such a transistor usually includes a gate dielectric layer formed on the semiconductor material of the wafer, followed by a gate having a width in the region of 0.15 microns. Ions are implanted next to the gate to form lightly doped regions. Spacers are then formed adjacent side walls of the gate and more ions are implanted adjacent the spacers. The spacers shield an area of the semiconductor material near the gate from the higher concentration of ions due to the second implantation step.

The formation of the spacers usually involves the deposition of a silicon nitride layer over and next to the gate, followed by an anisotropic etch which removes upper surfaces of the silicon nitride layer until the gate is exposed and surfaces of the semiconductor material outside the spacers are exposed for the second ion implantation step. The silicon nitride layer is deposited by introducing relatively high concentrations of $SiH_4$ and $NH_3$ gases into a chamber, which react with one another to form silicon nitride which then deposits out. Due to the high concentrations of these gases and other factors such as temperature, pressure, and flow rate, hydrogen is usually trapped within the silicon nitride layer. The hydrogen may diffuse into the gate and the semiconductor material thus affecting functioning of the transistor.

SUMMARY OF THE INVENTION

The invention provides a method of making a transistor. A gate dielectric layer is formed on a semiconductor substrate. A gate is formed on the dielectric layer, the gate having an exposed upper surface and exposed side surfaces. A first silicon nitride layer having a first thickness is deposited over the gate, for example over an oxide layer on the gate, at a first deposition rate. A second layer having a second thickness is deposited over the first silicon nitride layer at a second deposition rate, the second thickness being more than the first thickness and the second deposition rate being more than the first deposition rate. The second layer is then etched to leave spacers next to the side surfaces while exposing the upper surface of the gate and areas of the substrate outside the spacers. The first silicon nitride layer then has a lower hydrogen concentration than the second layer.

BRIEF DESCRIPTION OF THE DRAWINGS

The invention is further described by way of example with reference to the accompanying drawings wherein.

DETAILED DESCRIPTION OF THE INVENTION

Figure 1:
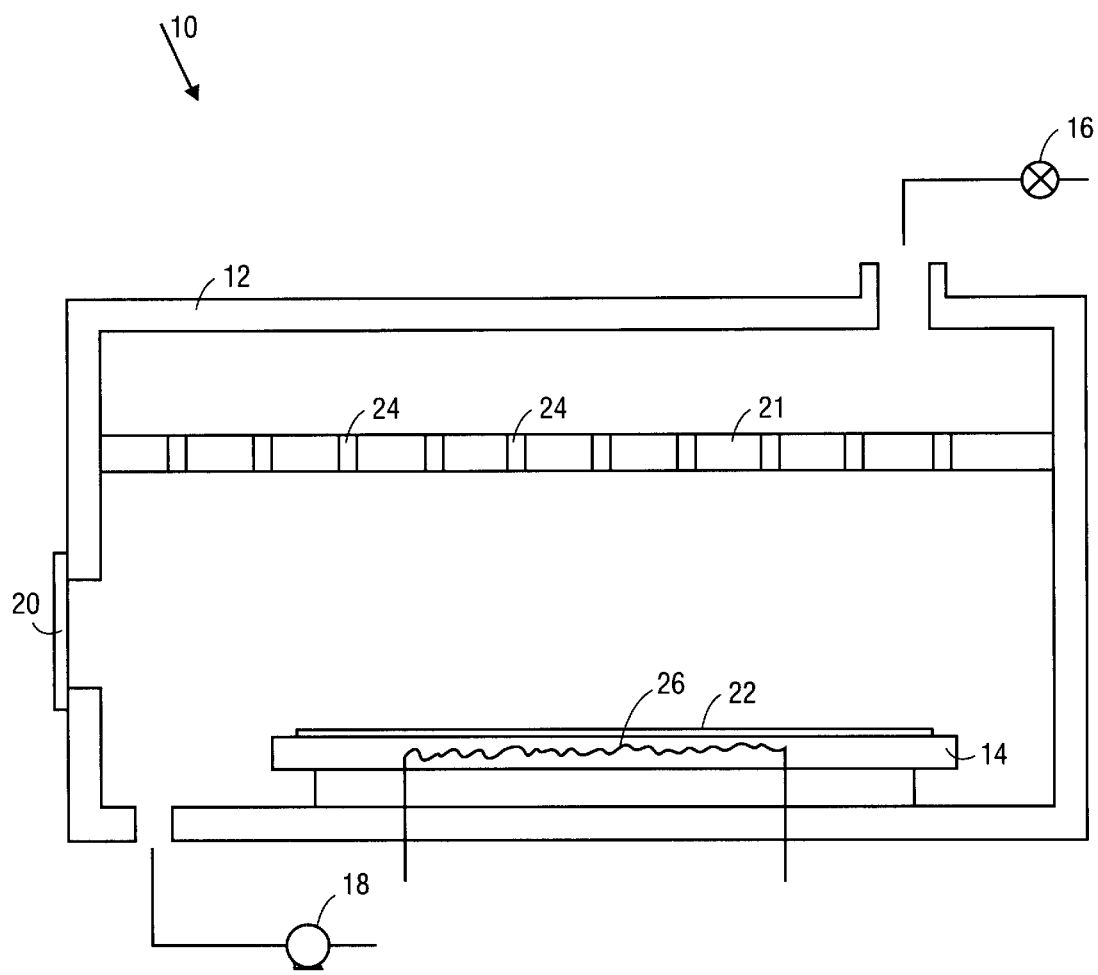
FIG. 1 is a cross-sectional side view illustrating an apparatus which may be used for carrying out the method according to the invention.

FIG. 1 of the accompanying drawings illustrates an apparatus 10 which is used for carrying out the method according to the invention. The apparatus includes a chamber 12, a susceptor 14, a valve 16, a pump 18, a slit valve 20, and a dispersion plate 21. The susceptor 14 is located in a base of the chamber 12. The valve 16 is connected to an upper part of the chamber 12 and the pump 18 is connected to a base of the chamber 12. The slit valve 20 opens and closes a slit valve opening in a side of the chamber 12. The dispersion plate 21 is located in the chamber 12 above the slit valve 20 and separates the chamber 12 into upper and lower portions.

In use, a wafer substrate 22 is inserted through the slit valve opening into the chamber 12 and located on the susceptor 14. The slit valve 20 then closes the slit valve opening. The valve 16 is closed and the pump 18 is switched on so that a pressure within the chamber 12 reduces. Gases are then introduced through the valve 16 into the chamber 12 and flow through openings 24 in the dispersion plate 21 through the chamber to the pump 18. The wafer substrate 22 is then exposed to the gases. The valve 16 is typically connected to a manifold which is connected to different gases. Different gases can thus be introduced into the chamber 12 at different times. The pump 18 can be operated to maintain the pressure within the chamber 12 at a certain level, or to increase or decrease the pressure. A resistive heater 26 is located within the susceptor 14. A current through the resistive heater 26 causes heating of the susceptor and the wafer substrate 22. An apparatus (not shown) is used to monitor the pressure within the chamber 12 and another apparatus (not shown) detects the temperature of the wafer substrate 22. The method according to the invention may be carried out in different chambers or all only in the apparatus 10 shown in FIG. 1.

Figure 2:
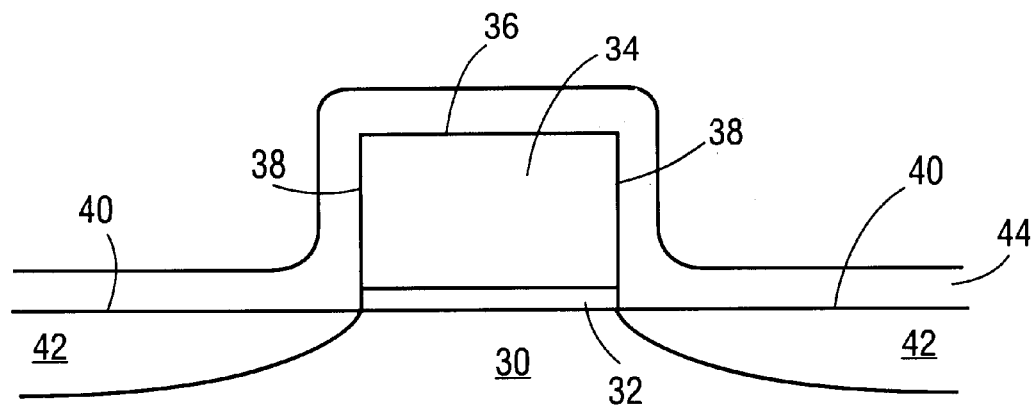
FIG. 2 is a cross-sectional side view illustrating an initial stage of semiconductor transistor fabrication.
Figure 3:
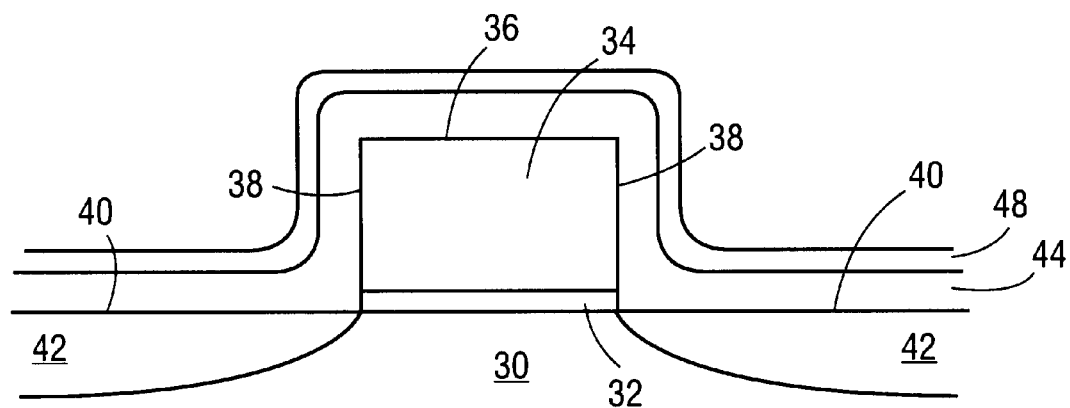
FIG. 3 is a view similar to FIG. 2 after a first silicon nitride layer is deposited.
Figure 4:
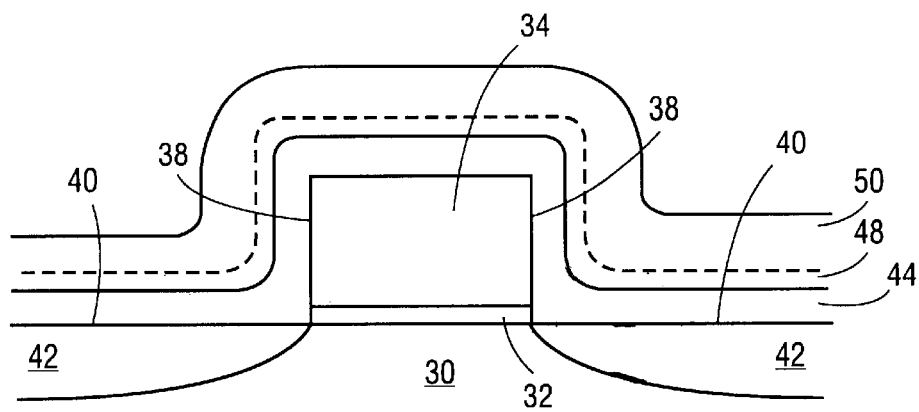
FIG. 4 is a view similar to FIG. 3 after a second silicon nitride layer is deposited.

FIG. 2 of the accompanying drawings illustrates initial fabrication of the transistor, all of which is conventional. A silicon wafer is provided on which a monocrystalline epitaxial silicon layer 30 is formed, followed by a gate dielectric layer 32, and then a transistor gate 34. The gate dielectric layer 32 is made of a dielectric material such as silicon oxide and is typically only a few tens of angstroms thick. The transistor gate 34 is typically made of a polysilicon which is later doped to make it conductive. The polysilicon layer is patterned utilizing conventional photoresist technology. Following patterning of the polysilicon layer, the transistor gate 34 remains with an exposed upper surface 36 and exposed side surfaces 38. Surfaces 40 of the epitaxial silicon layer 30 on opposing sides of the gate 34 are also exposed.

Following the patterning of the gate 34, ions are implanted into the surfaces 40. The implanted ions form lightly doped source and drain regions 42 on opposing sides of the gate 34. The ions dope the regions 42 oppositely to doping of the epitaxial silicon layer 30. The epitaxial silicon layer 30 may, for example, be N-doped and the regions 42 be P-doped.

A high-temperature oxide layer 44 is subsequently deposited. The high-temperature oxide layer 44 is located on the surfaces 36, 38, and 40. The intention of the high-temperature oxide layer 44 is to provide a good barrier which prevents diffusion of hydrogen from silicon nitride layers that are subsequently deposited into the gate 34, the epitaxial silicon layer 30, and the source and drain regions 42.

Figure 8:
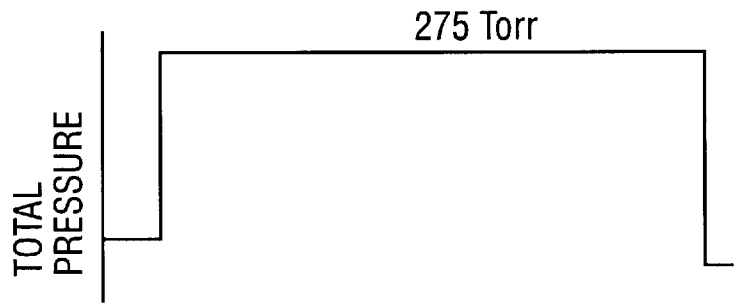
FIG. 8 is a time chart of total pressure during the deposition of the first and second silicon nitride layers.
Figure 9:
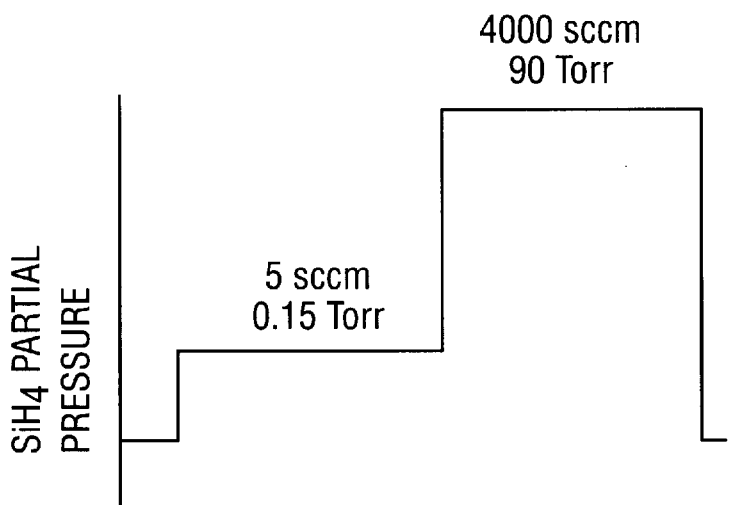
FIG. 9 is a time chart of $SiH_4$ partial pressure during the deposition of the first silicon nitride layer and the deposition of the second silicon nitride layer.

Processing is now illustrated, in time sequence, with respect to FIGS. 3–6. Reference is also made to FIGS. 7–10, which are time charts of processing conditions utilized according to an embodiment of the invention. FIG. 9, for example, illustrates $SiH_4$ partial pressure as it varies to obtain the layers shown in FIGS. 3 and 4.

Figure 7:
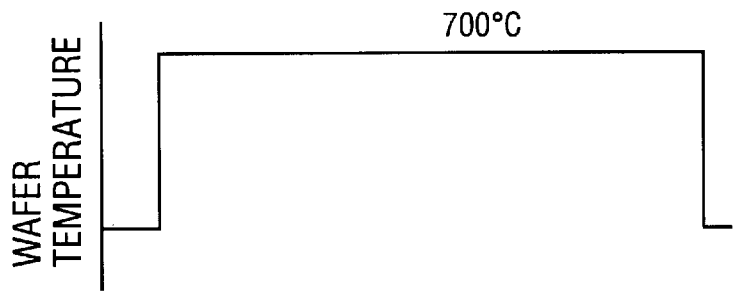
FIG. 7 is a time chart of wafer temperature during the formation of the first and second silicon nitride layer shown in FIGS. 3 and 4.

As shown in FIG. 7, the temperature of the wafer substrate is increased to approximately 700° C. As shown in FIG. 8, the total pressure within the chamber is increased from approximately 0 Torr to approximately 275 Torr by flowing an $N_2$ carrier gas into the chamber. In another embodiment, the temperature may be between 400° C. and 800° C. and the pressure between 50 and 350 Torr.

Figure 10:
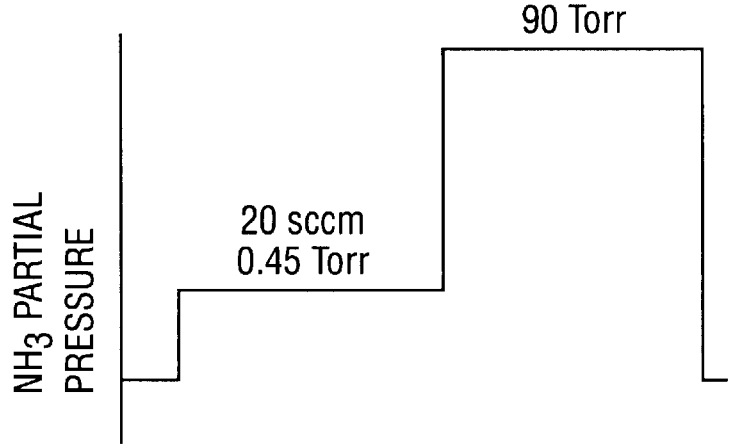
FIG. 10 is a time chart of $NH_3$ partial pressure during the deposition of the first silicon nitride layer and the second silicon nitride layer.

$SiH_4$ and $NH_3$ gases are introduced into the chamber, together with an $N_2$ carrier gas. As shown in FIG. 9, the $SiH_4$ gas has a partial pressure within the chamber of only approximately 0.15 Torr and flows at a rate of approximately 5 standard cubic centimeters (sccm). As shown in FIG. 10, the $NH_3$ gas has a partial pressure of only approximately 0.46 Torr and flows at a rate of approximately 20 sccm. The $SiH_4$ and $NH_3$ react with one another to form silicon nitride which deposits as a first silicon nitride layer 48. The first silicon nitride layer 48 forms on all surfaces of the high-temperature oxide layer 44. The first silicon nitride layer 48 forms at a rate of approximately 100 Å per minute, which is relatively low and has a thickness of approximately 100 Å. Because of the relatively low rate at which the first silicon nitride layer forms, relatively little hydrogen is trapped in the first silicon nitride layer 48. The first silicon nitride layer 48 is thus relatively pure. Not only does the purity of the first silicon nitride layer 48 contribute to less diffusion of hydrogen from the first silicon nitride layer 48 through the high-temperature oxide layer 44, but the first silicon nitride layer 48 also creates a barrier which prevents diffusion from layers formed on top of the first silicon nitride layer 48 therethrough to the high-temperature oxide layer 44 and components located below the high-temperature oxide layer 44.

In another embodiment, the deposition rate of the first silicon nitride layer 48 may be between 50 and 300 Å per minute. The first silicon nitride layer 48 may be between 50 and 200 Å thick. The partial pressure of the $SiH_4$ may be between 0.10 and 1.5 Torr. The total pressure may be between 50 and 350 Torr. The temperature may be between 400° C. and 800° C. It may also be possible to use other silicon-containing process gases instead of or in addition to $SiH_4$, such as $Si_2H_6$, etc. It may also be possible to form the first silicon nitride layer 48 utilizing another silicon nitride process such as a process known in the art as "atomic layer deposition."

The partial pressure of the $SiH_4$ is then increased to approximately 1.0 Torr and the flow rate of the $SiH_4$ is increased to approximately 50 sccm. The partial pressure of the $NH_3$ is simultaneously increased to approximately 90 Torr and the flow rate of the $NH_3$ is increased to approximately 4000 sccm. Temperature and pressure are maintained constant. The $SiH_4$ and $NH_3$ react with one another to form silicon nitride which deposits as a second silicon nitride layer 50. A boundary between the layers 48 and 50 may or may not be definite. The second silicon nitride layer 50 deposits on all upper and side surfaces of the first silicon nitride layer 48. The second silicon nitride layer deposits at a rate of between 500 and 1000 Å per minute and is approximately 700 Å thick. Because of the high rate of deposition of the second silicon nitride layer 50, it is likely that the second silicon nitride layer 50 may include more hydrogen and other contaminants. However, these contaminants do not diffuse through the barrier provided by the first silicon nitride layer 48 and the underlying silicon oxide layer 44, especially during subsequent high-temperature processing.

In another embodiment the second silicon nitride layer 50 may be between 300 and 1200 Å thick. The second silicon nitride layer 50 may deposit at a rate of between 300 and 2000 Å per minute. The second silicon nitride layer 50 may deposit at a rate which is at least 500 Å per minute higher than the deposition rate of the first silicon nitride layer 48. Partial pressure of the $SiH_4$ while depositing the second silicon nitride layer 50 may be between 1.5 and 100 Torr. The total pressure may be between 50 and 350 Torr while depositing the second silicon nitride layer 50. The wafer temperature while depositing the second silicon nitride layer 50 may be between 400 and 800° C. The partial pressure of the $SiH_4$ while depositing the second silicon nitride layer 50 may be at least 0.5 Torr, more preferably at least 1.0 Torr higher than the partial pressure while depositing the first silicon nitride layer 48. The second silicon nitride layer 50 is preferably at least three times, more preferably at least seven times as thick as the first silicon nitride layer 48. It may also be possible to form a silicon oxide layer instead of the second silicon nitride layer 50, the layers 44, 48, and 50 thus forming an oxide-nitride-oxide (ONO) structure with a more distinct boundary between the layers 48 and 50.

Figure 5:
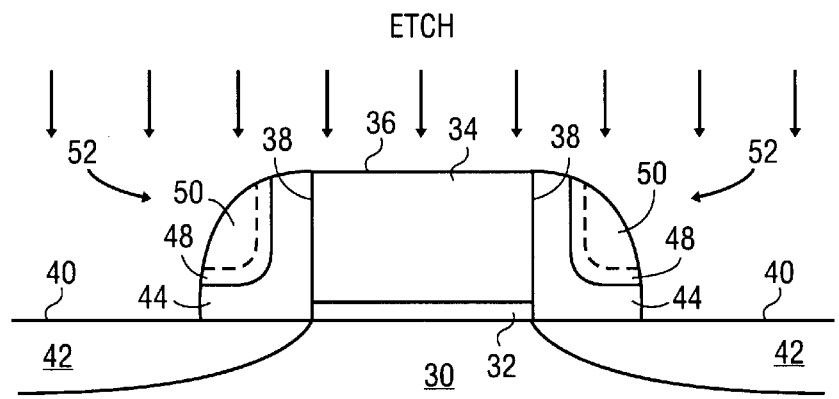
FIG. 5 is a view similar to FIG. 4 after an etch step.

FIG. 5 illustrates subsequent processing wherein the layers 44, 48, and 50 are etched back. An anisotropic etchant is used which removes upper surfaces of the layers 44, 48, and 50 without much removal of side surfaces of these layers. Etching is continued until the surfaces 40 and 36 are exposed. Spacers 52 remain on the surfaces 40 next to the side surfaces 38. Each spacer 52 includes a portion of the silicon oxide 44, a portion of the first silicon nitride layer 48, and a portion of the second silicon nitride layer 50. The location of the first silicon nitride layer 48 is L-shaped. The location of the second silicon nitride layer 50 is in a corner of the L shape of the first silicon nitride layer 48.

Figure 6:
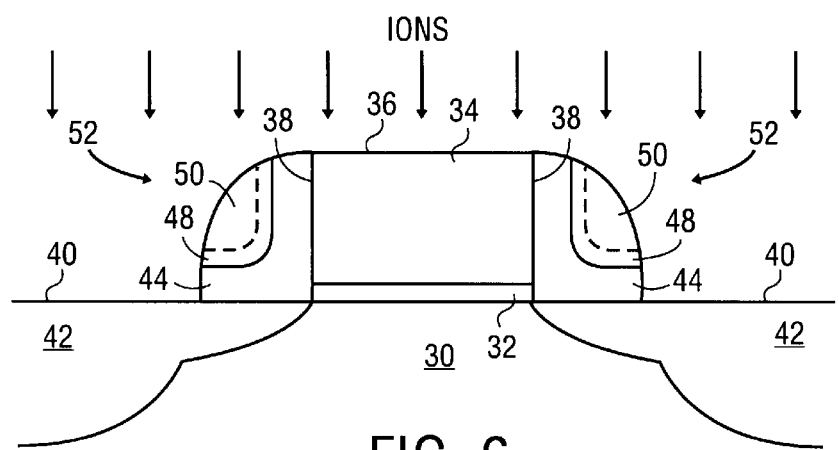
FIG. 6 is a view similar to FIG. 5 after implantation of ions.

As shown in FIG. 6, ions are then implanted into the surfaces 40. The spacers 52 prevent ion implantation into the silicon layer 30 below the spacers 52. The concentration and depth of the P-doped regions 42 is thereby increased below exposed areas of the surfaces 40.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of making a transistor, comprising:

forming a gate dielectric layer on a semiconductor substrate;

forming a gate on the gate dielectric layer, the gate having an exposed upper surface and exposed side surfaces;

depositing a first silicon nitride layer having a first thickness over the gate at a first deposition rate, the first silicon nitride layer having a relatively low amount of trapped hydrogen therein;

depositing a second silicon nitride layer having a second thickness over the first layer at a second deposition rate, the second thickness being more than the first thickness and the second deposition rate being more than the first deposition rate, the second silicon nitride layer having a relatively high amount of trapped hydrogen therein such that diffusion of the relatively high amount of trapped hydrogen through the first silicon nitride layer is reduced; and etching at least the second silicon nitride layer to leave spacers next to the side surfaces while exposing the upper surface of the gate and areas of the substrate outside the spacers.

2. The method of claim 1 wherein the first silicon nitride layer is deposited in a chamber at between 400 and 800° C.

3. The method of claim 1 wherein the first silicon nitride layer is deposited in a chamber at between 200 and 300 Torr.

4. The method of claim 1 wherein the first silicon nitride layer is deposited in a chamber out of $SiH_4$ gas at a partial pressure of between 0.10 and 1.5 Torr.

5. The method of claim 1 wherein the first deposition rate is between 50 and 300 Å/min.

6. The method of claim 1 wherein the first thickness is between 50 and 200 Å.

7. The method of claim 1 wherein the second layer is a silicon nitride layer.

8. The method of claim 7 wherein the second layer is deposited at a wafer temperature of between 400° C. and 800° C.

9. The method of claim 8 wherein the first and second layers are deposited at substantially the same temperature.

10. The method of claim 1 wherein the second silicon nitride layer is deposited in a chamber at between 50 and 300 Torr.

11. The method of claim 7 wherein the first and second layers are deposited at approximately the same temperature.

12. The method of claim 1 wherein the first silicon nitride layer is deposited in a chamber out of $SiH_4$ gas at a partial pressure of between 1.5 and 15 Torr.

13. The method of claim 1 wherein the first silicon nitride layer is deposited in a chamber out of $SiH_4$ at a first partial pressure and the second silicon nitride layer is deposited in a chamber out of $SiH_4$ at a second partial pressure which is at least 0.5 Torr higher than the first partial pressure.

14. The method of claim 13 wherein the second partial pressure is at least 1 Torr higher than the first partial pressure.

15. The method of claim 1 wherein the second deposition rate is between 300 and 2000 Å/min.

16. The method of claim 1 wherein the second deposition rate is at least 500 Å/min higher than the first deposition rate.

17. The method of claim 11 wherein the second thickness is between 300 Å and 1200 Å.

18. The method of claim 17 wherein the second thickness is at least three times the first thickness.

19. The method of claim 18 wherein the second thickness is approximately seven times the first thickness.

20. A method of making a transistor, comprising:

forming a gate dielectric layer on a semiconductor substrate;

forming a gate on the gate dielectric layer, the gate having an exposed upper surface and exposed side surfaces;

depositing a first silicon nitride layer having a first thickness over the gate at a temperature of between 400 and 800° C., a pressure of between 50 and 350 Torr, and from $SiH_4$ at a partial pressure of between 0.10 and 1.5 Torr, the first silicon nitride layer having a relatively low amount of trapped hydrogen therein; and depositing a second silicon nitride layer having a second thickness over the first silicon nitride layer at a temperature of between 400 and 800° C., a pressure of between 50 and 350 Torr, and from $SiH_4$ at a partial pressure which is at least 1.0 Torr higher than the partial pressure of $SiH_4$ when the first silicon nitride layer is formed, the second thickness being more than the first thickness, the second silicon nitride layer having a relatively high amount of trapped hydrogen therein such that diffusion of the relatively high amount of trapped hydrogen through the first silicon nitride layer is reduced.

* * * * *